US009554456B2

United States Patent
Hatazawa

(10) Patent No.: US 9,554,456 B2
(45) Date of Patent: Jan. 24, 2017

(54) LAYERED BODY WITH SUPPORT SUBSTRATE, METHOD FOR FABRICATING SAME, AND METHOD FOR FABRICATING MULTI-LAYER WIRING SUBSTRATE

(71) Applicant: HITACHI CHEMICAL COMPANY, LTD., Tokyo (JP)

(72) Inventor: Hiroki Hatazawa, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 17 days.

(21) Appl. No.: 14/655,472

(22) PCT Filed: Dec. 27, 2013

(86) PCT No.: PCT/JP2013/085185
§ 371 (c)(1),
(2) Date: Jun. 25, 2015

(87) PCT Pub. No.: WO2014/104328
PCT Pub. Date: Jul. 3, 2014

(65) Prior Publication Data
US 2016/0198564 A1    Jul. 7, 2016

(30) Foreign Application Priority Data
Dec. 28, 2012    (JP) ................. 2012-287777

(51) Int. Cl.
*H05K 1/02*    (2006.01)
*H05K 3/00*    (2006.01)
(Continued)

(52) U.S. Cl.
CPC .......... *H05K 1/0269* (2013.01); *H05K 1/0298* (2013.01); *H05K 3/0026* (2013.01);
(Continued)

(58) Field of Classification Search
USPC ........................................... 174/251
See application file for complete search history.

(56) References Cited

U.S. PATENT DOCUMENTS

2002/0053465 A1*   5/2002   Kawakita ............. H05K 3/4069
                                                                                                                    174/256
2003/0012004 A1*   1/2003   Uehara ................. H05K 1/112
                                                                                                                     361/748

FOREIGN PATENT DOCUMENTS

JP    2000323613    11/2000
JP    2001022098    1/2001
(Continued)

OTHER PUBLICATIONS

International Search Report date of mailing Feb. 10, 2014 for PCT/JP2013/085185 (2pgs).

*Primary Examiner* — Timothy Thompson
*Assistant Examiner* — Krystal Robinson
(74) *Attorney, Agent, or Firm* — Fitch, Even, Tabin & Flannery, LLP

(57) ABSTRACT

A layered body with a support substrate, the layered body being on the support substrate and comprising: metal foil B which is arranged on the support substrate and on which a wiring pattern is not formed; an insulating layer B which is arranged on the metal foil B; metal foil C which is arranged on the insulating layer B and on which a wiring pattern is not formed; non-through holes for a product and non-through holes for an alignment mark that penetrate the metal foil C and the insulating layer B and reach the metal foil B; and the alignment mark of a dot pattern in which the non-through holes for the alignment mark are filled by plating and gathered and arranged in an individually independent state.

10 Claims, 6 Drawing Sheets

(51) Int. Cl.
*H05K 3/22* (2006.01)
*H05K 3/46* (2006.01)

(52) U.S. Cl.
CPC ............. *H05K 3/22* (2013.01); *H05K 3/4679* (2013.01); *H05K 3/4652* (2013.01); *H05K 3/4682* (2013.01); *H05K 2201/09063* (2013.01); *H05K 2201/09918* (2013.01)

(56) References Cited

FOREIGN PATENT DOCUMENTS

| | | |
|---|---|---|
| JP | 2002033584 | 1/2002 |
| JP | 2004356219 | 12/2004 |
| JP | 2005236067 | 9/2005 |
| JP | 2008218804 | 9/2008 |
| JP | 2009094191 | 4/2009 |
| JP | 2009239105 | 10/2009 |
| JP | 4669908 | 1/2011 |
| JP | 2011129563 | 6/2011 |

* cited by examiner

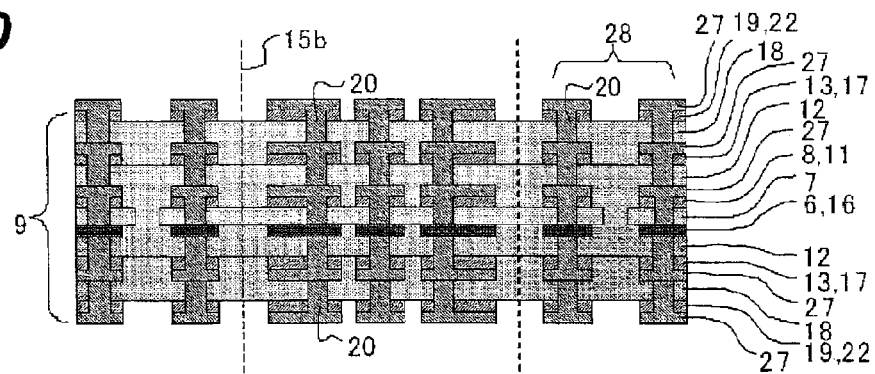
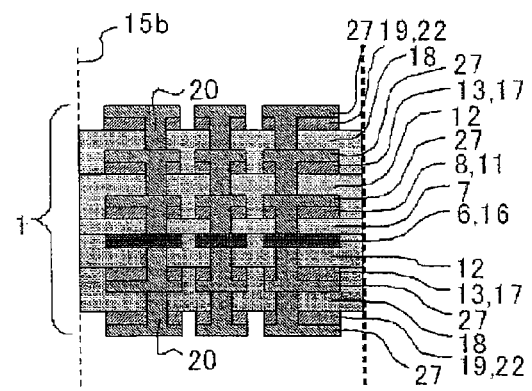

Fig.13(a')
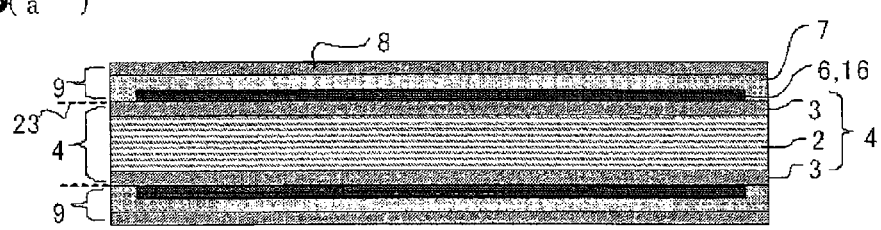
Fig.14(b')
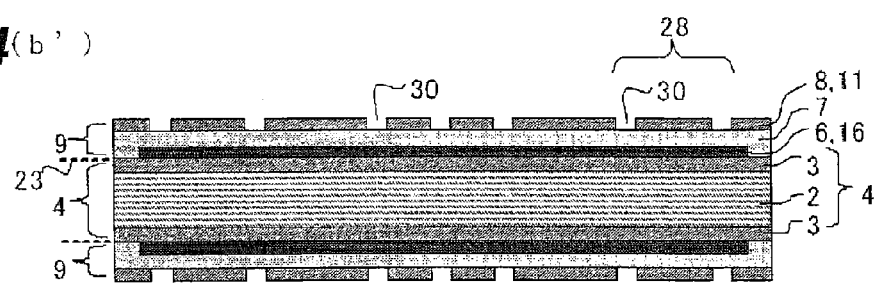
Fig.15(c')
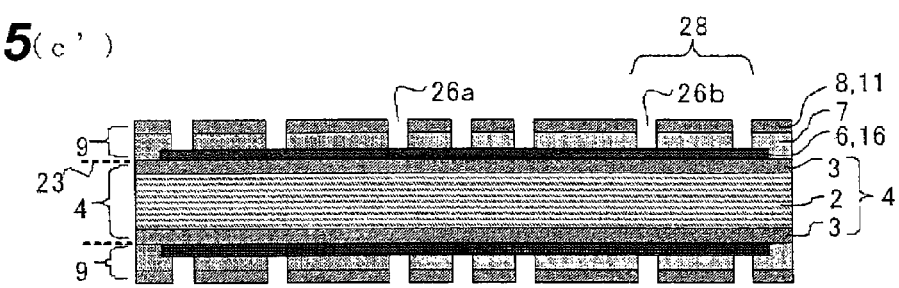

LAYERED BODY WITH SUPPORT SUBSTRATE, METHOD FOR FABRICATING SAME, AND METHOD FOR FABRICATING MULTI-LAYER WIRING SUBSTRATE

CROSS-REFERENCE TO RELATED APPLICATIONS

This Application is a U.S. National Stage Application filed under 35 U.S.C. §371 of International Application PCT/JP2013/085185, filed Dec. 27, 2013, designating the United States, which claims priority from French Patent Application 2012-287777, filed Dec. 28, 2012, the complete disclosures of which are hereby incorporated herein by reference in their entirety for all purposes.

TECHNICAL FIELD

The present invention relates to a layered body with a support substrate, a method for fabricating the same, and a method for fabricating a multi-layer wiring substrate, and in particular, relates to a layered body with a support substrate, to which a direct laser method is applicable even in a coreless method, a method for fabricating the same, and a method for fabricating a multi-layer wiring substrate.

BACKGROUND ART

For a multi-layer wiring substrate on which semiconductor elements are mounted, a multi-layer wiring substrate in which a buildup layer is formed on both surfaces of a core substrate is widely used. Here, the core substrate is a substrate to be a support substrate of the buildup layer, and includes an insulating layer and a wiring pattern on it, and as the insulating layer, generally, a rather rigid layer in which a thermosetting resin such as an epoxy resin is impregnated in a reinforcing material such as glass cloth and cured is used. Also, the buildup layer is a layer that is layered on the wiring pattern of the core substrate and includes an insulating layer and a wiring pattern on it. In recent years, together with thinning of the multi-layer wiring substrate and density increase of the wiring pattern, a multi-layer wiring substrate not including a core substrate has been provided. The multi-layer wiring substrate not including the core substrate (sometimes called a "coreless substrate", hereinafter) has merits that it is easy to be thinned and the wiring pattern can be formed in a high density.

As a method for fabricating such a coreless substrate, a method for fabricating a multi-layer wiring substrate by forming a laminate having a desired number of insulating layers and a wiring pattern on both surfaces of a metal foil clad laminate to be a support substrate, then separating the laminate from the support substrate, and performing subsequent processes to the separated laminate has been devised (see Patent Literatures 1 to 4). Also, a method for fabricating a multi-layer wiring substrate using a support substrate (sometimes called a "dummy core") which is used only in a fabricating process and does not configure the multi-layer wiring substrate itself to be a product in this way is called a coreless method hereinafter.

In the coreless method like this, as a method for forming a non-through hole for an interlayer connection of a multi-layer wiring substrate, a method (conformal method) for providing an opening on metal foil at a laser processing scheduled position, emitting a laser beam aiming at the opening, and processing an insulating layer thereunder with the metal foil as a mask is generally used.

CITATION LIST

Patent Literature

Patent Literature 1: Japanese Patent Application Laid-Open No. 2000-323613
Patent Literature 2: Japanese Patent Application Laid-Open No. 2004-356219
Patent Literature 3: Japanese Patent Application Laid-Open No. 2005-236067
Patent Literature 4: Japanese Patent No. 4669908

SUMMARY OF INVENTION

Technical Problem

In the case of this conformal method, as illustrated in FIGS. 13-16, since an alignment mark 28 (for example, a ring-like opening) to be a reference of laser processing and wiring pattern formation simultaneously can be formed when providing an opening 30 on metal foil C8 at a laser processing scheduled position, a positioning method of performing laser processing aiming at the opening 30 of the metal foil C8 with the alignment mark 28 as a reference and using the alignment mark 28 in common similarly for the wiring pattern formation after forming an interlayer connection by plating or the like can be considered. By this method, position accuracy of non-through holes formed by laser processing and the wiring pattern (a land in particular) can be secured.

In recent years, demands for cost reduction in addition to thinning and density increase have been severe, and as a method for responding to the demand, it can be considered to apply a method (direct laser method) for processing metal foil and an insulating layer thereunder by directly emitting a laser beam without providing an opening on the metal foil at the laser processing scheduled position as a method for forming a non-through hole for an interlayer connection after using the coreless method capable of thinning and density increase.

However, as illustrated in FIG. 1, in the direct laser method, the opening (window hole) at the laser processing scheduled position and the alignment mark (for example, the ring-like opening) to be a reference of the laser processing and the wiring pattern formation are not provided on the metal foil C8 before the laser processing like the case of the conformal method described above. Therefore, the laser processing and the wiring pattern formation cannot be performed with the alignment mark provided on the metal foil C8 as a common reference like the case of the conformal method. Also, as illustrated in FIG. 1, in the case of the coreless method using a layered body 29 with a support substrate in which plain metal foil B6 having no wiring pattern thereon, an insulating layer B7 and the metal foil C8 are laminated and integrated on a support substrate 4, the metal foil B6 which is a lower layer of the metal foil C8 is a solid conductor layer on which the wiring pattern is not formed yet, and the reference (alignment mark) for positioning of the laser processing and the wiring pattern formation is not provided on the metal foil B6 either. Therefore, there is a possibility of position shift of a non-through hole formed by the laser processing and the wiring pattern (a land, in particular).

As a measure against this, a method for forming a wiring pattern with a non-through hole formed by the direct laser method itself as the reference can be considered. It is a method for forming a non-through hole for an interlayer connection and a non-through hole for a positioning reference (alignment mark) of the wiring pattern formation by the direct laser method.

However, in the direct laser method, while metal foil is directly processed by a laser, the metal foil is originally to be a mask of the laser processing and laser processability is degraded. Even though it is improved by performing surface treatment (roughening treatment or the like) for making it easy to absorb a laser beam to a metal foil surface, the surface treatment (roughening treatment or the like) tends to be lost by melting or the like of the metal foil near a part where the laser processing is performed, and it becomes hard to absorb the laser beam, so that it is hard to form a shape that openings are continued on the metal foil. Therefore, since it is difficult to form an opening like a ring shape for example, that is generally used as the alignment mark, by the non-through hole formed by the direct laser method, there is a possibility that readability as the alignment mark becomes insufficient.

The present invention has been made in consideration of the problems described above, and an object of the present invention is to provide a layered body with a support substrate, in which position accuracy of non-through holes and a wiring pattern by a direct laser method is excellent and to which the direct laser method is applicable even in a coreless method, a method for fabricating the same, and a method for fabricating a multi-layer wiring substrate.

Solution to Problem

The present invention is a layered body with a support substrate, the layered body being on the support substrate and comprising metal foil B arranged on the support substrate, an insulating layer B arranged on the metal foil B, metal foil C arranged on the insulating layer B, a non-through hole for a product and non-through holes for an alignment mark that penetrate the metal foil C and the insulating layer B and reach the metal foil B, and the alignment mark of a dot pattern in which the non-through holes for the alignment mark are filled by plating and gathered and arranged in an individually independent state.

Thus, since a wiring pattern is not formed on the metal foil B, it is applicable also to the coreless method of arranging the solid metal foil B on which the wiring pattern is not formed on the support substrate. Also, since the wiring pattern is not formed on the metal foil C, the direct laser method is applicable. Also, the non-through hole for the product and the non-through holes for the alignment mark are formed by the same position reference by being processed in one laser processing step. Further, since the non-through holes for the alignment mark are filled by the plating, contrast is easily formed in the case of reading the alignment mark by an X-ray observation device. Also, since it is the alignment mark of the dot pattern, even dots can be recognized as a pattern. Therefore, since readability of the alignment mark can be secured, position accuracy of the non-through holes and the wiring pattern in the case of the direct laser method can be secured.

In the above, it is preferable that the alignment mark is the dot pattern in which the non-through holes for the alignment mark are gathered and arranged in a multiple ring shape in the individually independent state.

Thus, since the alignment mark is the dot pattern gathered and arranged in the multiple ring shape, even if the dot pattern formed by laser processing is partially missing, a missing part can be corrected using the other part, and influence of position accuracy decline due to missing of dots can be suppressed.

In one of the above, it is preferable that the support substrate includes an insulating layer A and metal foil A, and the layered body includes the metal foil B which is arranged directly on the metal foil A and is one size smaller than the metal foil A, the insulating layer B which is one size larger than the metal foil B, the metal foil C which is arranged on the insulating layer B, and the non-through hole for the product and the non-through holes for the alignment mark that penetrate the metal foil C and the insulating layer B and reach the metal foil B.

That is, the metal foil B is not bonded with the metal foil A of the support substrate, and is fixed to the support substrate by bonding the insulating layer B that is one size larger and the metal foil A and sealing the metal foil B. Therefore, just by cutting and removing a part where the insulating layer B and the metal foil A are bonded on the outer periphery of the metal foil B, the support substrate and the layered body can be easily separated so that the coreless method using the direct laser method becomes easy.

The present invention is a method for fabricating the layered body with the support substrate in any one of the above, the method comprising a step (a) of piling up, on the metal foil A of the support substrate, the metal foil B one size smaller than the metal foil A, the insulating layer B one size larger than the metal foil B, and the metal foil C in this order, and heating, pressurizing, laminating and integrating them, a step (b) of forming the non-through hole for the product and the non-through holes for the alignment mark of the dot pattern from the metal foil C to the metal foil B by penetrating the metal foil C and the insulating layer B by a laser, and a step (c) of filling the non-through hole for the product and the non-through holes for the alignment mark by plating.

Thus, since the support substrate and the layered body are easily separated with the metal foil B on the layered body side arranged directly on the metal foil A on the support substrate side, the coreless method becomes easy. Also, since the non-through hole for the product and the non-through holes for the alignment mark of the dot pattern from the metal foil C to the metal foil B are formed and the plating is filled, the readability of the alignment mark can be secured, and even in the case of applying the direct laser method, the position accuracy of the non-through holes and the wiring pattern can be secured.

The present invention is a method for fabricating a multi-layer wiring substrate comprising, after the step (c) in the above-described method for fabricating the layered body with the support substrate, a step (d) of separating the support substrate and the layered body, a step (e) of forming a guide hole for positioning of the wiring pattern with the non-through holes for the alignment mark of the dot pattern filled with the plating on the separated layered body as the reference, a step (f) of forming etching resist with the guide hole as the reference, and a step (g) of forming the wiring pattern by etching the metal foil B or C.

Thus, since the guide hole to be the reference of the wiring pattern formation is formed with the non-through holes for the alignment mark of the dot pattern filled with the plating on the separated layered body as the a reference, even in the case of applying the direct laser method, the position accuracy of the non-through holes and the wiring pattern can be secured.

Advantageous Effects of Invention

According to the present invention, it is possible to provide a layered body with a support substrate, in which position accuracy of non-through holes and a wiring pattern by a direct laser method is excellent and to which the direct laser method is applicable even in a coreless method, a method for fabricating the same, and a method for fabricating a multi-layer wiring substrate.

BRIEF DESCRIPTION OF DRAWINGS

FIG. 10 illustrates a step j in the method for fabricating the layered body or the multi-layer wiring substrate in the present embodiment.

FIG. 11 illustrates a step k in the method for fabricating the layered body or the multi-layer wiring substrate in the present embodiment.

FIG. 13 illustrates a step a' in the method for fabricating the layered body or the multi-layer wiring substrate in the case of a conformal method.

FIG. 14 illustrates a step b' in the method for fabricating the layered body or the multi-layer wiring substrate in the case of the conformal method.

FIG. 15 illustrates a step c' in the method for fabricating the layered body or the multi-layer wiring substrate in the case of the conformal method.

DESCRIPTION OF EMBODIMENTS

Layered Body with Support Substrate

A layered body with a support substrate in the present embodiment will be described below using FIG. 3 and FIG. 12.

Figure 3C:
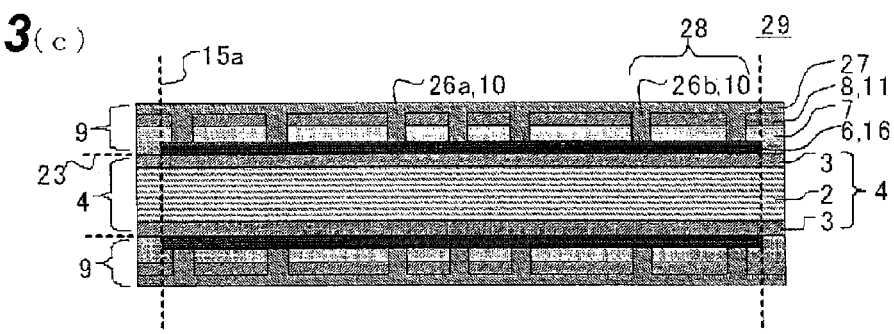
FIG. 3 illustrates a step c in the method for fabricating the layered body or the multi-layer wiring substrate in the present embodiment.
Figure 12:
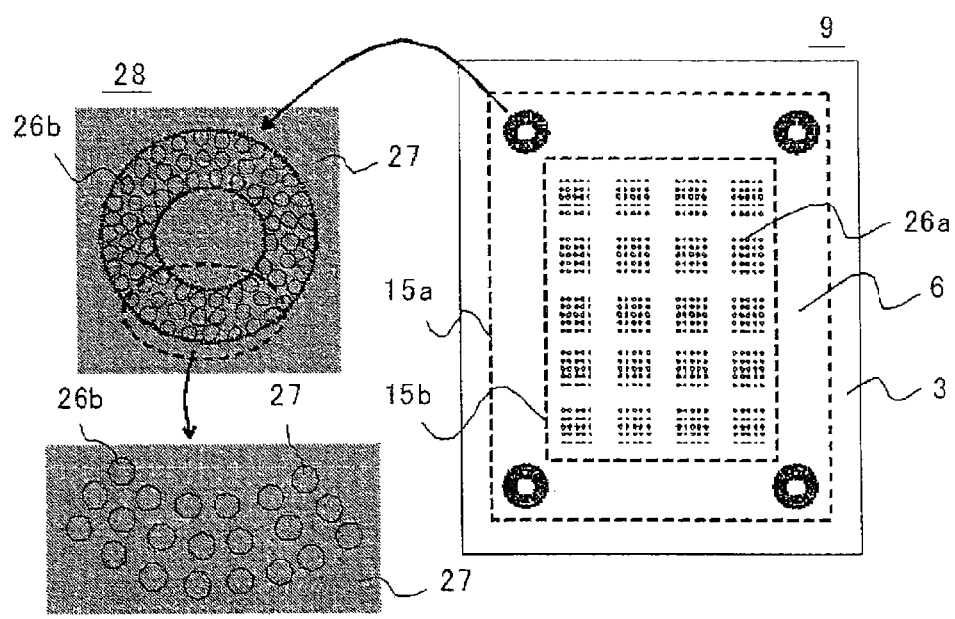
FIG. 12 illustrates a plan view of the layered body and an alignment mark in the present embodiment.
Figure 16:
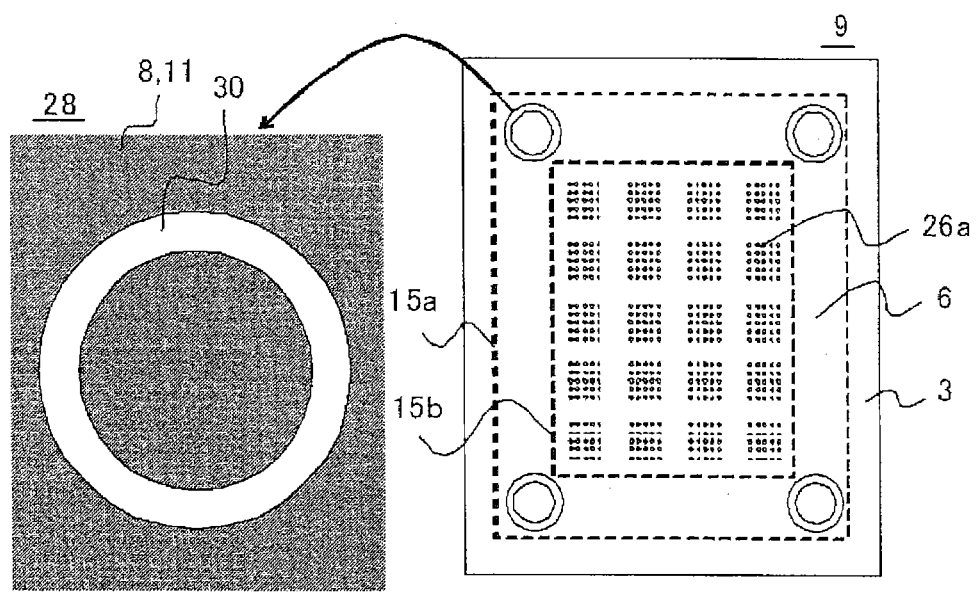
FIG. 16 illustrates a plan view of the layered body and the alignment mark in the case of the conformal method.

As illustrated in FIG. 3 and FIG. 12, a layered body 29 with a support substrate in the present embodiment is the layered body 29 with the support substrate comprising a support substrate 4 and a layered body 9 on the support substrate 4. In the layered body 29 with the support substrate, the layered body 9 includes metal foil B6 which is arranged on the support substrate 4 and on which a wiring pattern is not formed, an insulating layer B7 which is arranged on the metal foil B6, metal foil C8 which is arranged on the insulating layer B7 and on which the wiring pattern is not formed, non-through holes 26a for a product and non-through holes 26b for an alignment mark that penetrate the metal foil C8 and the insulating layer B7 and reach the metal foil B6, and the alignment mark 28 of a dot pattern in which the non-through holes 26b for the alignment mark are filled by plating 27 and gathered and arranged in an individually independent state.

For the support substrate 4, a metal foil clad laminate 4 in which metal foil A3 is stuck to both surfaces of an insulating layer A2 made of glass epoxy is used. As the support substrate 4, without being limited to the metal foil clad laminate 4, anything can be used without particular limitation as long as it can support the layered body 9 to be a product in handling in a fabricating process, however, from an aspect of versatility, it is preferably an insulated substrate or a copper foil clad laminate used in general multi-layer wiring substrate fabrication.

On the support substrate 4, the metal foil B6 on which the wiring pattern is not formed is arranged. The fact that the wiring pattern is not formed means that the wiring pattern is not formed by etching or the like. As the metal foil B6, it is preferable from a point of the versatility to use copper foil used in multi-layer wiring substrate fabrication. The metal foil B6 is in a state of the metal foil on which the wiring pattern is not formed as it is, and the wiring pattern is not formed including the wiring pattern to be the alignment mark. In this way, since the wiring pattern is not formed on the metal foil B6, it can be used even in the coreless method of arranging the metal foil B6 on which the wiring pattern is not formed on the support substrate 4.

On the metal foil B6, the insulating layer B7 is arranged. As the insulating layer B7, a resin film such as an epoxy resin or a polyimide resin or a prepreg in which a resin such as the epoxy resin or a phenol resin is impregnated and cured in a glass base material such as glass cloth or glass non-woven fabric can be used.

On the insulating layer B7, the metal foil C8 on which the wiring pattern is not formed is arranged. The metal foil C8 is in the state that the wiring pattern is not formed, and the wiring pattern is not formed including the wiring pattern to be the alignment mark. In this way, since the wiring pattern is not formed on the metal foil C, the direct laser method is applicable.

The non-through holes 26a for the product and the non-through holes 26b for the alignment mark that penetrate the metal foil C8 and the insulating layer B7 and reach the metal foil B6 are formed. The non-through holes 26a for the product and the non-through holes 26b for the alignment mark are formed by the same position reference by being processed by one laser processing step. The non-through holes that penetrate the metal foil C8 and the insulating layer B7 and reach the metal foil B6 can be formed by directly processing the metal foil C8 using the direct laser method.

As illustrated in FIG. 12, the alignment mark 28 of the dot pattern in which the non-through holes 26b for the alignment mark are filled by the plating 27 and gathered and arranged in the individually independent state is provided. In this way, since the non-through holes 26b for the alignment mark are filled by the plating 27, contrast is easily formed in the case of reading the alignment mark 28 by an X-ray observation device. Also, since dots are in the individually independent state and the dots are not continuously connected, a gap is secured between the dot and the dot, so that the adjacent dot is formed avoiding a part where a surface roughened shape is lost on the metal foil C8 near the dot by the laser processing, and the dot pattern can be formed while maintaining the processability of a laser. Here, the individually independent state means that the adjacent non-through holes 26b for the alignment mark are arranged in the state of not overlapping with each other in a planar view, and it is not needed to be electrically independent. Further, since it is the alignment mark of the dot pattern, even the dots can be recognized as a pattern. Therefore, since the readability of the alignment mark can be secured, the position accuracy of the non-through holes and the wiring pattern in the case of the direct laser method can be secured.

As illustrated in FIG. 12, it is preferable that the alignment mark 28 is the dot pattern in which the non-through holes 26b for the alignment mark are gathered and arranged in a multiple ring shape in the individually independent state. To a surface of the metal foil C8, surface treatment (roughening treatment or the like) for making it easy to absorb a laser beam is performed in order to improve laser processability, however, the surface treatment (roughening treatment or the like) tends to be lost by melting or the like of the metal foil C8 near a part where the laser processing is performed, and since it becomes hard to absorb the laser beam, formation of the dots by the laser processing sometimes becomes incomplete. However, since the alignment mark 28 is the dot pattern gathered and arranged in the multiple ring shape, even if the dot pattern formed by the laser processing is partially missing, a missing part can be corrected using the other part, and influence of position accuracy decline due to missing of the dots can be suppressed.

As illustrated in FIG. 3, it is preferable that the support substrate 4 includes the insulating layer A2 and the metal foil A3, and the layered body 9 includes the metal foil B6 which is arranged directly on the metal foil A3 and is one size smaller than the metal foil A3, the insulating layer B7 which is one size larger than the metal foil B6, the metal foil C8 which is arranged on the insulating layer B7, and the non-through holes 26a for the product and the non-through holes 26b for the alignment mark that penetrate the metal foil C8 and the insulating layer B7 and reach the metal foil B6. That is, the metal foil B6 is not bonded with the metal foil A3 of the support substrate 4, and is fixed to the support substrate 4 by bonding the insulating layer B7 that is one size larger and the metal foil A3 and sealing the metal foil B6. Therefore, just by cutting and removing a part where the insulating layer B and the metal foil A3 are bonded on the outer periphery of the metal foil B6, the support substrate 4 and the layered body 9 can be easily separated so that the coreless method using the direct laser method becomes easy.

<Modification of Layered Body with Support Substrate>

Figure 1A:
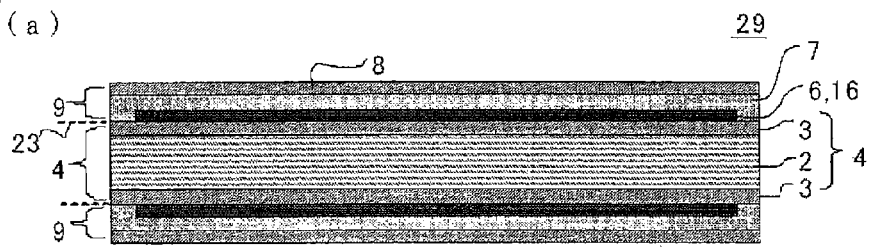
FIG. 1 illustrates a step a in a method for fabricating a layered body or a multi-layer wiring substrate in the present embodiment.

As a modification of the layered body 29 with the support substrate in the present embodiment, as the support substrate 4, the metal foil clad laminate 4 in which composite metal foil having two or more layers of metal foil stacked together in a physically peelable manner is stuck, instead of the metal foil A3 and the metal foil B6 in FIG. 1, to both surfaces of the insulating layer A2 made of the glass epoxy may be used. Examples of the composite metal foil like this include so-called copper foil with carrier copper foil (or peelable copper foil) including the carrier copper foil to be a support layer and ultrathin copper foil used generally for formation of the wiring pattern. The copper foil with a thickness of about 9-70 μm is generally used as the carrier foil, and the copper foil with the thickness of about 1-9 μm is used as the ultrathin copper foil. Using the composite metal foil, the carrier copper foil side of the composite metal foil is stuck to the insulating layer A2. In the case of using the metal foil clad laminate 4 in which the composite metal foil is stuck in this way, in FIG. 1, the carrier copper foil corresponds to the metal foil A3 and the ultrathin copper foil corresponds to the metal foil B6. Therefore, the need of the metal foil B6 is eliminated. Also, by performing peeling between the carrier copper foil and the ultrathin copper foil of the composite metal foil, the layered body 9 and the support substrate 4 of the layered body 29 with the support substrate can be separated.

<Method for Fabricating Layered Body with Support Substrate>

A method for fabricating the layered body with the support substrate in the present embodiment will be described below using FIG. 1 to FIG. 3.

Figure 2B:
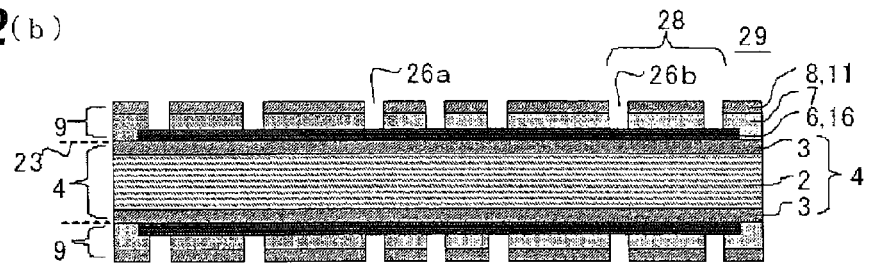
FIG. 2 illustrates a step b in the method for fabricating the layered body or the multi-layer wiring substrate in the present embodiment.

As illustrated in FIG. 1 to FIG. 3, the method for fabricating the layered body 29 with the support substrate in the present embodiment comprises a step (a) of piling up, on the metal foil A3 of the support substrate 4, the metal foil B6 one size smaller than the metal foil A3, the insulating layer B7 one size larger than the metal foil B6, and the metal foil C8 in this order, and heating, pressurizing, laminating and integrating them (FIG. 1), a step (b) of forming the non-through holes 26a for the product and the non-through holes 26b for the alignment mark of the dot pattern from the metal foil C8 to the metal foil B6 by penetrating the metal foil C8 and the insulating layer B7 by a laser (FIG. 2), and a step (c) of filling the non-through holes 26a for the product and the non-through holes 26b for the alignment mark with the plating 27 (FIG. 3). Thus, since the support substrate 4 and the layered body 9 are easily separated with the metal foil B6 on the side of the layered body 9 arranged directly on the metal foil A3 on the side of the support substrate 4, the coreless method becomes easy. Also, since the non-through holes 26a for the product and the non-through holes 26b for the alignment mark of the dot pattern from the metal foil C8 to the metal foil B6 are formed and the plating 27 is filled, the readability of the alignment mark 28 can be secured, and even in the case of applying the direct laser method, the position accuracy of the non-through holes and the wiring pattern can be secured.

<Method for Fabricating Multi-Layer Wiring Substrate>

A method for fabricating a multi-layer wiring substrate in the present embodiment will be described below using FIG. 1 to FIG. 11.

Figure 5:
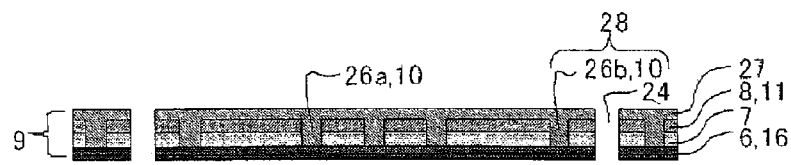
FIG. 5 illustrates a step e in the method for fabricating the layered body or the multi-layer wiring substrate in the present embodiment.
Figure 6:
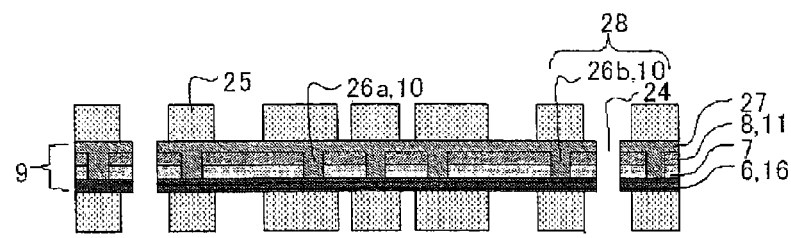
FIG. 6 illustrates a step f in the method for fabricating the layered body or the multi-layer wiring substrate in the present embodiment.
Figure 7:
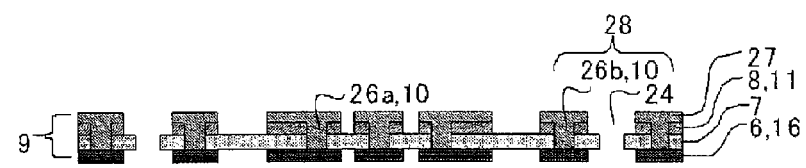
FIG. 7 illustrates a step g in the method for fabricating the layered body or the multi-layer wiring substrate in the present embodiment.

As illustrated in FIG. 1 to FIG. 11, the method for fabricating a multi-layer wiring substrate 1 in the present embodiment comprises, after the step (c) in the above-described method for fabricating the layered body 29 with the support substrate (FIG. 3), a step (d) of separating the support substrate 4 and the layered body 9 (FIG. 4), a step (e) of forming a guide hole 24 for positioning of the wiring pattern with the non-through holes 26b for the alignment mark of the dot pattern filled with the plating 27 on the separated layered body 9 as the reference (FIG. 5), a step (f) of forming etching resist 25 with the guide hole 24 as the reference (FIG. 6), and a step (g) of forming the wiring pattern by etching the metal foil B6 or C8 (FIG. 7). Thus, since the guide hole 24 to be the reference of the wiring pattern formation is formed with the non-through holes 26b for the alignment mark of the dot pattern filled with the plating 27 of the separated layered body 9 as the reference, even in the case of applying the direct laser method, the position accuracy of the non-through holes (here, the non-through holes 26a for the product, the non-through holes 26b for the alignment mark) and the wiring pattern (here, a wiring pattern C11) can be secured.

Examples

Examples of the present invention will be described hereinafter using FIG. 1 to FIG. 12, however, the present invention is not limited to the examples.

First, as the support substrate 4, a copper foil clad laminate (the metal foil clad laminate 4) in which copper foil A3 with a thickness of 12 μm was stuck to a glass epoxy material (the insulating layer A2) was prepared.

Next, as illustrated in FIG. 1, on both sides of the support substrate 4, a glossy surface of copper foil B6, which was one size smaller than the copper foil A3 of the copper foil clad laminate 4, was arranged so as to face the copper foil A3 of the copper foil clad laminate 4. On the outer side, as the insulating layer B7, a prepreg and copper foil C8 on the outer side were configured, and were laminated by vacuum hot press, and a laminate 29 with the support substrate was formed.

Next, the surface of the copper foil C8 on both outer sides of the laminate 29 with the support substrate was roughened.

Then, as illustrated in FIG. 2, the laser processing by the direct laser method was performed using a carbon dioxide laser processing apparatus from a surface side of the copper foil C8 to which roughening treatment was performed, and the non-through holes 26a for the product and the non-through holes 26b for the alignment mark that penetrate the copper foil C8 and the insulating layer B7 and reach the copper foil B6 were formed. The diameter of the thus formed non-through holes 26a and 26b was 80 μm, and the depth of the hole (the thickness of the insulating layer B7) was 20-70 μm. Also, as illustrated in FIG. 12, the non-through holes 26b for the alignment mark formed the alignment mark 28 of the dot pattern gathered and arranged in a triple ring shape in the individually independent state. An outer periphery of the triple ring of the dot pattern was 3250 μm, its inner periphery was 2750 μm, and the individual dots were formed at a pitch of 120-140 μm and had a gap of 40-60 μm. By having the gap of at least 40 μm between the dots in this way, even when a roughened shape on the surface of the copper foil C8 near the non-through holes (dots) is damaged by performing the laser processing by the direct laser method, the influence is hardly received and the laser processability can be secured.

Next, etching was performed for about 2 μm from the surface side of the copper foil C8, and processing residue and the roughened shape of the copper foil C8 that remained on the surface of the copper foil C8 were removed.

Next, as illustrated in FIG. 3, to the non-through holes 26a for the product and the non-through holes 26b for the alignment mark, desmear treatment, plating pretreatment (degreasing, catalyst imparting, thin electroless copper plating), and electrolytic filled via plating were performed, the plating 27 was filled, and an interlayer connection BC was formed.

Next, after reducing the entire conductor thickness by performing etching from a plating layer side on the copper foil C8, buffing was performed further and the surface was smoothed.

Figure 4D:
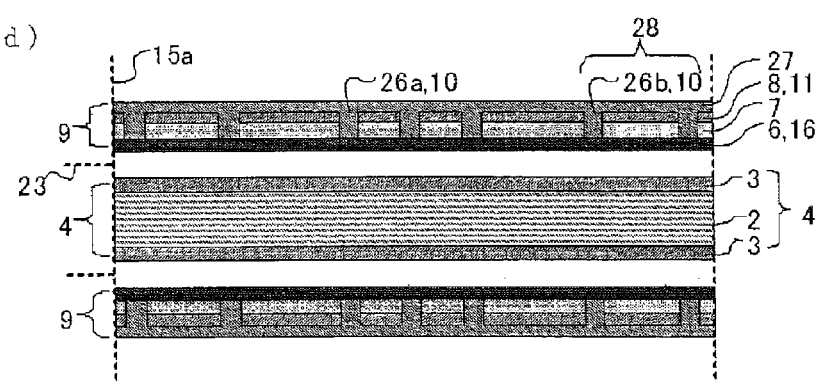
FIG. 4 illustrates a step d in the method for fabricating the layered body or the multi-layer wiring substrate in the present embodiment.

Next, as illustrated in FIG. 4, by cutting and removing an outer peripheral part of the copper foil B6 of the layered body 29 with the support substrate at a cutting position 15a slightly on the inner side of the outer periphery of the copper foil B6, the support substrate 4 and one each of upper and lower layered bodies 9 were separated respectively at a separating position 23, and the two layered bodies 9 were obtained. Hereinafter, of the layered bodies 9 obtained by being separated from the support substrate 4, only the layered body 9 on the upper side will be taken up and described.

Next, as illustrated in FIG. 12, the alignment mark 28 of the dot pattern gathered and arranged in the triple ring shape was used as a reference, and the pattern was read and its center was drilled by a drill machine with an X-ray observation device to form the guide hole 24, as illustrated in FIG. 5.

Next, as illustrated in FIG. 6, on both surfaces (the surface of the plating 27 on the copper foil C8 and the surface of the copper foil B6) of the layered body 9, etching resist was formed. Positioning when exposing the etching resist was performed with the guide hole 24 as the reference.

Next, as illustrated in FIG. 7, on both surfaces of the layered body 9, a wiring pattern B16 and the wiring pattern C11 having a predetermined wiring pattern were formed by an etching method.

Then, the surface of the obtained wiring pattern C11 was roughened by roughening treatment liquid.

Figure 8:
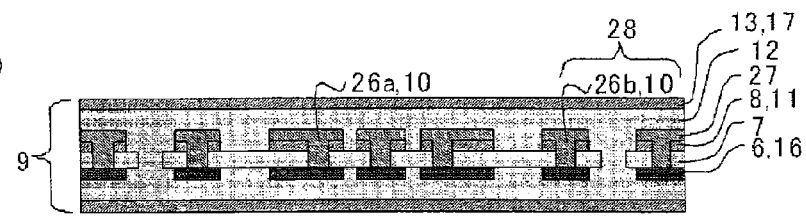
FIG. 8 illustrates a step h in the method for fabricating the layered body or the multi-layer wiring substrate in the present embodiment.

Next, as illustrated in FIG. 8, the prepreg as an insulating layer C12, and ultrathin copper foil with a carrier in which carrier copper foil (not shown in the figure) with the thickness of 18 μm was stuck to ultrathin copper foil D13 with the thickness of 5 μm on the outer side were configured so that the roughened surface of the ultrathin copper foil D13 of 5 μm was bonded with the insulating layer C12, and were laminated by vacuum hot press, the carrier copper foil (not shown in the figure) of 18 μm was peeled, and thus the layered body 9 was formed.

Figure 9:
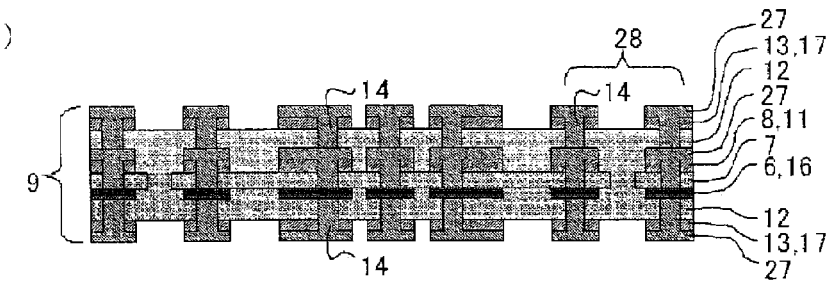
FIG. 9 illustrates a step i in the method for fabricating the layered body or the multi-layer wiring substrate in the present embodiment.

Then, as illustrated in FIG. 9, the layered body 9 was provided with a hole (not shown in the figure) for the interlayer connection, an interlayer connection CD14 interlayer-connecting the copper foil D13 and the wiring pattern C11 was formed by filled plating, and then, the wiring pattern of a wiring pattern D17 was formed by the etching method.

Next, on both upper and lower sides of the layered body 9 where the wiring pattern D17 was formed, the prepreg as an insulating layer D18, and ultrathin copper foil with a carrier in which carrier copper foil (not shown in the figure) with the thickness of 18 μm was stuck to ultrathin copper foil E19 with the thickness of 5 μm on the outer side were configured so that the roughened surface of the ultrathin copper foil E19 of 5 μm was bonded with the insulating layer D18, and were laminated by vacuum hot press, the carrier copper foil (not shown in the figure) of 18 μm was peeled, and thus the layered body 9 was formed.

Next, as illustrated in FIG. 10, the layered body 9 was provided with the hole for the interlayer connection, an interlayer connection DE20 interlayer-connecting the copper foil E19 and the wiring pattern D17 was formed by filled plating, and then, the wiring pattern of a wiring pattern E22 was formed by the etching method.

Then, as illustrated in FIG. 11, by cutting at a cutting position 15b of the layered body 9 and removing an area where the alignment mark 28 was formed by the non-through holes for the alignment mark, the multi-layer wiring substrate 1 was obtained.

INDUSTRIAL APPLICABILITY

The layered body with the support substrate, a method for fabricating the same, and a method for fabricating a multi-layer wiring substrate of the present invention are industrially effective since the position accuracy of the non-through holes and the wiring pattern by the direct laser method is excellent and the direct laser method is applicable even in the coreless method.

REFERENCE SIGNS LIST

1: Multi-layer wiring substrate
2: Insulating layer A
3: Metal foil A or copper foil A
4: Support substrate or metal foil clad laminate or copper foil clad laminate
6: Metal foil B or copper foil B
7: Insulating layer B
8: Metal foil C or copper foil C
9: Layered body
10: Interlayer connection BC
11: Wiring pattern C
12: Insulating layer C
13: Metal foil D or copper foil D
14: Interlayer connection CD
15a: Cutting position (when separating support substrate and layered body respectively at separating position)
15b: Cutting position (when removing area where alignment mark is formed)
16: Wiring pattern B
17: Wiring pattern D
18: Insulating layer D
19: Metal foil E or copper foil E
20: Interlayer connection DE
21: Interlayer connection BE
22: Wiring pattern E
23: Separating position
24: Guide hole
25: Etching resist
26: Non-through hole
26a: Non-through hole for product
26b: Non-through hole for alignment mark
27: Plating
28: Alignment mark
29: Layered body with support substrate
30: Opening (window hole)

The invention claimed is:

1. A layered body with a support substrate, the layered body being on the support substrate and comprising:
   metal foil B arranged on the support substrate;
   an insulating layer B arranged on the metal foil B;
   metal foil C arranged on the insulating layer B;
   a non-through hole for a product and non-through holes for an alignment mark that penetrate the metal foil C and the insulating layer B and reach the metal foil B; and
   the alignment mark of a dot pattern in which the non-through holes for the alignment mark are filled by plating and gathered and arranged in an individually independent state.

2. The layered body with the support substrate according to claim 1,
   wherein the alignment mark is the dot pattern in which the non-through holes for the alignment mark are gathered and arranged in a multiple ring shape in the individually independent state.

3. The layered body with the support substrate according to claim 1,
   wherein the support substrate includes an insulating layer A and metal foil A, and
   wherein the layered body includes the metal foil B which is arranged directly on the metal foil A and is one size smaller than the metal foil A, the insulating layer B which is one size larger than the metal foil B, the metal foil C arranged on the insulating layer B, and the non-through hole for the product and the non-through holes for the alignment mark that penetrate the metal foil C and the insulating layer B and reach the metal foil B.

4. A method for fabricating the layered body with the support substrate according to claim 1, the method comprising:
   a step (a) of piling up, on metal foil A of the support substrate, metal foil B one size smaller than the metal foil A, an insulating layer B one size larger than the metal foil B, and metal foil C in this order, and heating, pressurizing, laminating and integrating them;
   a step (b) of forming a non-through hole for a product and non-through holes for an alignment mark of a dot pattern from the metal foil C to the metal foil B by penetrating the metal foil C and the insulating layer B by a laser; and
   a step (c) of filling the non-through hole for the product and the non-through holes for the alignment mark by plating.

5. A method for fabricating a multi-layer wiring substrate comprising:
   after the step (c) in claim 4,
   a step (d) of separating the support substrate and the layered body;
   a step (e) of forming a guide hole for positioning of a wiring pattern with non-through holes for an alignment mark of a dot pattern filled with plating on the separated layered body as a reference;
   a step (f) of forming etching resist with the guide hole as a reference; and
   a step (g) of forming the wiring pattern by etching the metal foil B or C.

6. A layered product comprising:
   a support substrate; and
   a layered body arranged on the substrate, wherein the layered body comprising:
   first metal foil arranged on the support substrate;
   an first insulating layer arranged on the first metal foil;
   second metal foil arranged on the first insulating layer;
   a non-through hole for a product and non-through holes for an alignment mark that penetrate the second metal foil and the first insulating layer and reach the first metal foil; and
   the alignment mark of a dot pattern in which the non-through holes for the alignment mark are filled by plating and gathered and arranged in an individually independent state.

7. The layered product according to claim 6,
   wherein the alignment mark is the dot pattern in which the non-through holes for the alignment mark are gathered and arranged in a multiple ring shape in the individually independent state.

8. The layered product according to claim 6,
   wherein the support substrate comprises an second insulating layer and third metal foil, and
   wherein the first metal foil of the layered body is arranged directly on the third metal foil of the support substrate and is smaller than the third metal foil, and the first insulating layer is larger than the first metal foil.

9. A method for fabricating the layered product of claim 8, the method comprising:

piling up the first metal foil, the first insulating layer, and the second metal foil above the third metal foil of the support substrate in this order, and heating, pressurizing, laminating and integrating them;

forming the non-through hole for a product and the non-through holes for the alignment mark of the dot pattern from the second metal foil to the first metal foil by penetrating the second metal foil and the first insulating layer by a laser; and filling the non-through hole for the product and the non-through holes for the alignment mark by plating.

10. A method for fabricating a multi-layer wiring substrate comprising:

providing the layered product of claim 8;

separating the support substrate and the layered body of the layered product after the providing;

forming a guide hole for positioning of a wiring pattern with the non-through holes for the alignment mark of the dot pattern filled with plating on the separated layered body as a reference;

forming etching resist with the guide hole as a reference; and forming the wiring pattern by etching at least one of the first and second metal foil.

* * * * *